(12) United States Patent
Cui et al.

(10) Patent No.: US 11,533,031 B2
(45) Date of Patent: Dec. 20, 2022

(54) AMPLIFIER, AMPLIFICATION CIRCUIT AND PHASE SHIFTER

(71) Applicant: HUAWEI TECHNOLOGIES CO., LTD., Guangdong (CN)

(72) Inventors: Keji Cui, Shanghai (CN); Yongli Wang, Shenzhen (CN); Lei Lu, Shanghai (CN)

(73) Assignee: Huawei Technologies Co., Ltd., Guangdong (CN)

( * ) Notice: Subject to any disclaimer, the term of this patent is extended or adjusted under 35 U.S.C. 154(b) by 69 days.

(21) Appl. No.: 17/037,224

(22) Filed: Sep. 29, 2020

(65) Prior Publication Data

US 2021/0013850 A1 Jan. 14, 2021

Related U.S. Application Data

(63) Continuation of application No. PCT/CN2018/086614, filed on May 11, 2018.

(51) Int. Cl.
*H03F 3/16* (2006.01)
*H03F 1/22* (2006.01)
(Continued)

(52) U.S. Cl.
CPC ......... *H03F 3/45183* (2013.01); *H03F 1/223* (2013.01); *H03F 1/301* (2013.01);
(Continued)

(58) Field of Classification Search
CPC ...... H03F 3/45183; H03F 1/223; H03F 1/301; H03F 2200/318; H03F 2200/504;
(Continued)

(56) References Cited

U.S. PATENT DOCUMENTS

| 5,886,578 A | 3/1999 | Miyashita et al. |
| 6,046,640 A * | 4/2000 | Brunner ............... H03G 1/0023 330/311 |

(Continued)

FOREIGN PATENT DOCUMENTS

| CN | 1381950 A | 11/2002 |
| CN | 105048979 A | 11/2015 |

(Continued)

OTHER PUBLICATIONS

Lee et al., "A 5-GHz Highly Linear Floating-Body CMOS LNA With Switched Gain Control," Microwave and Optical Technology Letters, vol. 59, No. 3, Mar. 2017, pp. 593-596.

(Continued)

*Primary Examiner* — Khanh V Nguyen
(74) *Attorney, Agent, or Firm* — Fish & Richardson P.C.

(57) ABSTRACT

Amplifiers, amplification circuits, and phase shifters, for example, for flexibly adjusting an output phase to thereby meet a requirement of a constant phase on a link in a communications field, are provided. In one aspect, an amplifier includes first, second, and third MOS transistors. The first MOS transistor includes a gate separately coupled to a signal input end and a bias voltage input end, a source coupled to a power supply, and a drain separately coupled to sources of the second and third MOS transistors. A drain of the third MOS transistor is coupled to a ground, and a drain of the second MOS transistor is coupled to a signal output end. The bias voltage input end is configured to receive a bias voltage to adjust a phase difference between an input signal at the signal input end and an output signal at the signal output end.

19 Claims, 12 Drawing Sheets

(51) Int. Cl.
*H03F 3/45* (2006.01)
*H03F 1/30* (2006.01)
*H03F 3/193* (2006.01)

(52) U.S. Cl.
CPC ........ *H03F 3/193* (2013.01); *H03F 2200/318* (2013.01); *H03F 2200/504* (2013.01)

(58) Field of Classification Search
CPC ........... H03F 2200/09; H03F 2200/408; H03F 2200/451; H03F 2200/537; H03F 1/3205; H03F 1/56; H03F 3/193; H03F 3/211; H03F 3/245; H03F 3/45179; H03F 3/45475; H03F 3/16; H03F 3/45192; H03F 3/45089; H03F 3/1935; H03F 2200/372; H03G 1/0023; H03G 1/0088; H03G 3/3063; H03G 1/0029
USPC ................ 330/277, 253, 302, 310, 311
See application file for complete search history.

(56) References Cited

U.S. PATENT DOCUMENTS

| | | | | |
|---|---|---|---|---|
| 6,215,355 B1* | 4/2001 | Meck | ........................ | H03F 3/72 330/311 |
| 6,392,487 B1* | 5/2002 | Alexanian | ............ | H03G 1/0023 330/254 |
| 6,566,963 B1* | 5/2003 | Yan | ........................... | H03F 1/22 330/285 |
| 6,600,377 B2* | 7/2003 | Sasaki | .................. | H03G 1/0088 330/285 |
| 6,628,170 B2* | 9/2003 | Titus | ........................ | H03F 1/22 330/278 |
| 7,463,093 B2* | 12/2008 | Taylor | .................. | H03G 1/0029 330/311 |
| 2004/0066236 A1 | 4/2004 | Fujimoto et al. | | |
| 2005/0077968 A1 | 4/2005 | Behzad | | |
| 2009/0015335 A1* | 1/2009 | Floyd | ........................ | H03F 3/16 330/285 |
| 2011/0074509 A1 | 3/2011 | Samavedam et al. | | |
| 2015/0048889 A1 | 2/2015 | Lin et al. | | |

FOREIGN PATENT DOCUMENTS

| | | |
|---|---|---|
| CN | 106921356 A | 7/2017 |
| CN | 107404291 A | 11/2017 |
| CN | 105518991 B | 5/2018 |
| EP | 1313211 A1 | 5/2003 |

OTHER PUBLICATIONS

PCT International Search Report and Written Opinion issued in International Application No. PCT/CN2018/086614 dated Feb. 19, 2019, 11 pages (partial English translation).

EPO partial supplementary European Search Report issued in European Application No. 18917874.2 dated Dec. 23, 2020, 14 pages.

Hsieh et al., "A 57-64 GHZ Low-phase-variation Variable-gain Amplifier," 2012 IEEE/MTT-S International Microwave Symposium Digest, Jun. 17, 2021, 4 pages.

Kao et al., "A 60 GHZ Variable-Gain Low-Noise Amplifier with Low Phase Variation," 2016 IEEE International Symposium on Radio-Frequency Integration Technology (RFIT), Aug. 24, 2016, 4 pages.

Mayer et al., "Analysis and reduction of phase variations of variable gain amplifiers verified by CMOS implementation at C-band," IET Circuits Devices and Systems, Nov. 4, 2009, 8 pages.

Huiying et al., "A Fully-Differential Operational Amplifier for Class D Audio Amplifier," Microelectronics, vol. 42, No. 1, Feb. 2012, 4 pages (with English abstract).

Office Action issued in Chinese Application No. 201880093325.5 dated Oct. 13, 2022, 5 pages.

\* cited by examiner

AMPLIFIER, AMPLIFICATION CIRCUIT AND PHASE SHIFTER

CROSS-REFERENCE TO RELATED APPLICATION

This application is a continuation of International Application No. PCT/CN2018/086614, filed on May 11, 2018. The disclosure of the aforementioned application is hereby incorporated by reference in its entirety.

TECHNICAL FIELD

This application relates to the field of electronic technologies, and in particular, to an amplifier, an amplification circuit, and a phase shifter.

BACKGROUND

With the rapid development of fifth-generation mobile communications technology (5G), the phased array antenna technology has gradually become an important research direction for 5G transceivers. To ensure the dynamic range of the transceiver, a variable gain amplifier (VGA) needs to be added to a receiving/transmitting link. The receiving link is used as an example. When a signal received by an antenna is strong, a gain of the receiving link needs to be reduced to avoid saturation of output of the receiving link, increasing nonlinearity of the receiving link, and increasing a bit error rate. In addition, in the phased array system, when the gain of the VGA is changed, the phase of the VGA needs to be kept constant, so as to avoid changing a receiving angle of the antenna when switching the gain. Therefore, constant phase variable gain amplifiers are becoming more important in 5G communications systems.

Conventional variable gain amplifiers are mainly categorized into two types. The first type of implementation is DSA (digital switched attenuator)+fixed gain amplifier. The DSA is implemented by a passive component. To achieve a constant phase, a phase compensation component such as an inductor Lc needs to be disposed in the digital switched attenuator. Consequently, the entire VGA layout area increases, thereby increasing the costs of dies. Because the phase compensation component disposed in the digital switched attenuator is usually a hardware component, an amount of change in the phase of the link is usually fixed. The second type of implementation is to use an active circuit to perform gain switching by switching a bias current or load of the amplifier. However, the second type of implementation cannot ensure a constant phase. Similarly, if the effect of a constant phase is required, a passive component needs to be added or active current injection is needed for phase compensation. In short, for both of the two types of implementation, a phase compensation solution for the link needs to be separately designed, and an amount of change in the phase is usually fixed. This cannot well meet the requirement for a constant phase.

SUMMARY

Embodiments of this application provide an amplifier, an amplification circuit, and a phase shifter, so as to flexibly adjust an output phase, thereby meeting a requirement for a constant phase of a link.

According to a first aspect, this application provides an amplifier, including a first MOS transistor, a second MOS transistor, and a third MOS transistor, where a gate of the first MOS transistor is separately coupled to a signal input end and a bias voltage input end, a source of the first MOS transistor is coupled to a power supply, a drain of the first MOS transistor is separately coupled to a source of the second MOS transistor and a source of the third MOS transistor, a drain of the third MOS transistor is coupled to the ground, and a drain of the second MOS transistor is coupled to a signal output end; a gate of the second MOS transistor is used to make the second MOS transistor in a conductive state under control of a first gate control signal; a gate of the third MOS transistor is used to: under control of a second gate control signal, change a cut-off state or a conductive state of the third MOS transistor to perform bypass control on an alternating current signal that is output by the drain of the first MOS transistor: the bias voltage input end is used to receive a bias voltage, so as to adjust a phase difference between an input signal at the signal input end and an output signal at the signal output end. In the foregoing solution, when the second MOS transistor is in the conductive state, the third MOS transistor can be controlled to be cut off; when the gain of the amplifier needs to be changed, the third MOS transistor is controlled to be conducted, and the third MOS transistor bypasses a part of the alternating current signal to the ground GND of the power supply, so that the gain of the amplifier decreases and the amplifier enters another gain state, so as to achieve a variable gain. In addition, when the gain changes, the bias voltage is input to the bias voltage input end to adjust the phase difference between the input signal at the signal input end and the output signal at the signal output end; for example, when the third MOS transistor is cut off, a first bias voltage is input to the bias voltage input end of the first MOS transistor, and is kept constant, when the gain needs to be changed, the third MOS transistor is conducted when the bias voltage of the first MOS transistor at the bias voltage input end is changed, for example, a second bias voltage less than the first bias voltage is provided. In this state, due to the decrease of the bias voltage of the first MOS transistor, transconductance gm of the first MOS transistor decreases, and the gain of the amplifier may decrease, thereby achieving a variable gain. In the process of switching the gain, the phase difference is introduced mainly by changing the transconductance of the second MOS transistor and the third MOS transistor. In this way, when the state of the third MOS transistor is switched (from the cut-off state to the conductive state), changing the bias voltage that is input to the first MOS transistor at the bias voltage input end causes a current signal flowing through the first MOS transistor to change. When the bias voltage of the first MOS transistor is changed properly, the transconductance of the second MOS transistor and the third MOS transistor can be adjusted, so as to flexibly adjust an output phase. In addition, when the transconductance of the second MOS transistor when the third MOS transistor is in the cut-off state is equal to the sum of the transconductance of the second MOS transistor and the transconductance of the third MOS transistor when the third MOS transistor is in the conductive state, the requirement for a constant phase of the link can be met.

In an example solution, when the third MOS transistor is in the cut-off state, the bias voltage received by the bias voltage input end is the first bias voltage: when the third MOS transistor is in the conductive state, the bias voltage received by the bias voltage input end is the second bias voltage; the first bias voltage is greater than the second bias voltage. When the bias voltage input end receives the first bias voltage, the amplifier is in the first gain state; when the bias voltage input end receives the second bias voltage, the amplifier is in the second gain state: the first gain is greater than the second gain.

In an example solution, the second bias voltage is determined based on the first bias voltage and a formula $g_{m2,max}-(g_{m2}+g_{m3})$, where $g_{m2,max}$ represents the transconductance of the second MOS transistor when the amplifier is in the first gain state; $g_{m2}$ represents the transconductance of the second MOS transistor when the amplifier is in the second gain state; $g_{m3}$ represents the transconductance of the third MOS transistor in the conductive state. When $g_{m2,max}=g_{m2}+g_{m3}$, the requirement for a constant phase of the link is met.

In an example solution, the amplifier further includes a bias circuit, where the bias circuit includes a current source and a fourth MOS transistor; one end of the current source is coupled to the ground, and the other end of the current source is coupled to a drain of the fourth MOS transistor and a gate of the fourth MOS transistor; the gate of the fourth MOS transistor is coupled to the bias voltage input end, and the source of the fourth MOS transistor is coupled to the power supply.

In an example solution, the gate of the first MOS transistor is connected to the bias voltage input end through a voltage divider resistor.

In an example solution, to ensure working stability of the amplifier, the amplifier further includes at least one fifth MOS transistor connected in parallel with the first MOS transistor, where a gate of the fifth MOS transistor is coupled to the gate of the first MOS transistor: a source of the fifth MOS transistor is coupled to the source of the first MOS transistor; a drain of the fifth MOS transistor is coupled to the drain of the first MOS transistor. The amplifier further includes at least one sixth MOS transistor connected in parallel with the second MOS transistor, where a gate of the sixth MOS transistor is coupled to the gate of the second MOS transistor: a source of the sixth MOS transistor is coupled to the source of the second MOS transistor; a drain of the sixth MOS transistor is coupled to the drain of the second MOS transistor. The amplifier further includes at least one seventh MOS transistor connected in parallel with the third MOS transistor, where a gate of the seventh MOS transistor is coupled to the gate of the third MOS transistor: a source of the seventh MOS transistor is coupled to the source of the third MOS transistor: a drain of the seventh MOS transistor is coupled to the drain of the third MOS transistor.

In the foregoing first aspect and its possible implementations, a single-ended amplifier is provided. Certainly, an embodiment of this application further provides a differential amplifier that is based on the foregoing single-ended amplifier. The differential amplifier includes two amplifiers as described above, where a bias voltage input end of a first amplifier is coupled to a bias voltage input end of a second amplifier.

According to a second aspect, this application provides an amplification circuit, where the amplification circuit includes at least a first amplifier and a second amplifier: an input matching network and an output matching network are provided between the first amplifier and the second amplifier; a signal output end of the first amplifier is coupled to an input end of the output matching network; an output end of the output matching network is coupled to an input end of the input matching network; an output end of the input matching network is coupled to a signal input end of the second amplifier; the output matching network is used to convert a first voltage value of a signal output end of the first amplifier into a second voltage value: the input matching network is used to convert the second voltage value into a third voltage value: at least either of the first amplifier and the second amplifier is the amplifier in the first aspect.

In addition, when using a differential amplifier, the amplification circuit includes a first differential amplifier and a second differential amplifier, where an input matching network and an output matching network are provided between a first differential amplifier and a second differential amplifier; a signal output end of a first amplifier of the first differential amplifier is coupled to a first input end of the output matching network, and a signal output end of a second amplifier of the first differential amplifier is coupled to a second input end of the output matching network; a first output end of the output matching network is coupled to a first input end of the input matching network, and a second output end of the output matching network is coupled to a second input end of the input matching network; a first output end of the input matching network is coupled to a signal input end of a first amplifier of the second differential amplifier, and a second output end of the input matching network is coupled to a signal input end of a second amplifier of the second differential amplifier: the output matching network is used to convert a first differential signal that is output by the first differential amplifier into a second differential signal; the input matching network is used to convert the second differential signal into a third differential signal. At least one of the first differential amplifier and the second differential amplifier is the amplifier in the first aspect.

According to a third aspect, this application provides a phase shifter, including a first amplifier, a second amplifier, a third amplifier, and a matching network, where a signal output end of the first amplifier is coupled to a first input end of the matching network, and a signal output end of the second amplifier is coupled to a second input end of the matching network; a first output end of the matching network is coupled to a signal input end of the third amplifier, and a second input end of the matching network is coupled to the ground; the matching network is used to convert a first voltage difference between the signal output end of the first amplifier and the signal output end of the second amplifier into a second voltage difference, and the amplifier includes any amplifier as described in the first aspect. At least one of the first amplifier, the second amplifier, and the third amplifier is the amplifier in the first aspect.

In addition, when using a differential amplifier, the phase shifter includes a first differential amplifier, a second differential amplifier, a third differential amplifier, and a matching network, where a signal output end of a first amplifier of the first differential amplifier is coupled to a first input end of the matching network, and a signal output end of a second amplifier of the first differential amplifier is coupled to a second input end of the matching network: a signal output end of a first amplifier of the second differential amplifier is coupled to a third input end of the matching network, and a signal output end of a second amplifier of the second differential amplifier is coupled to a fourth input end of the matching network; a first output end of the matching network is coupled to a signal input end of a first amplifier of the third differential amplifier, and a second input end of the matching network is coupled to a signal input end of a second amplifier of the third differential amplifier; the matching network is used to combine a first differential signal that is output by the first differential amplifier and a second differential signal that is output by the second differential amplifier into a third differential signal. At least one of the first differential amplifier, the second differential amplifier, and the third differential amplifier is the amplifier in the first aspect.

According to a fourth aspect, this application provides a transceiver, including the amplifier provided in the first aspect, or including the amplification circuit provided in the second aspect, or the phase shifter provided in the third aspect.

According to a fifth aspect, this application provides a transmitter, including the amplifier provided in the first aspect, or including the amplification circuit provided in the second aspect, or the phase shifter provided in the third aspect.

According to a sixth aspect, this application provides a receiver, including the amplifier provided in the first aspect, or including the amplification circuit provided in the second aspect, or the phase shifter provided in the third aspect.

According to a seventh aspect, this application provides a communications device, including the transceiver provided in the fourth aspect, the receiver provided in the fifth aspect, or the transmitter provided in the sixth aspect.

BRIEF DESCRIPTION OF DRAWINGS

To describe the technical solutions in the embodiments of this application more clearly, the following briefly describes the accompanying drawings for describing the embodiments.

DESCRIPTION OF EMBODIMENTS

Figure 1:
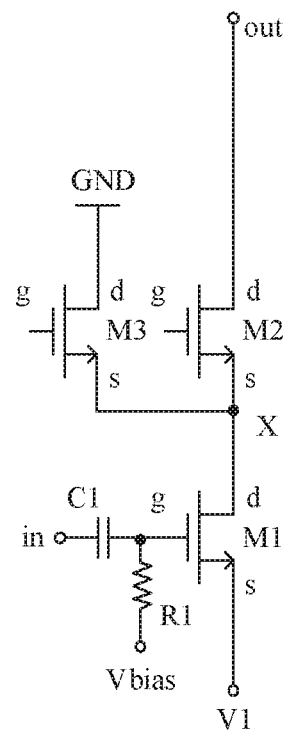
FIG. 1 is a schematic structural diagram of an amplifier according to an embodiment of this application.

The following describes the embodiments of this application with reference to accompanying drawings.

The embodiments of this application are applied to a radio frequency signal transceiver, receiver, or transmitter of a communications apparatus, where the communications apparatus is a wireless communications apparatus, including but not limited to user equipment, a base station, and the like.

The communications device may be user equipment, and the user equipment may be configured to communicate with one or more user equipment devices (for example, D2D communication), or may be configured to communicate with one or more base stations. The user equipment may be further referred to as a user terminal, and may include some or all of functions of a system, a subscriber unit, a subscriber station, a mobile station, a mobile terminal, a mobile device, a node, a device, a remote station, a remote terminal, a terminal, a wireless communications device, a wireless communications apparatus, or a user agent. The user equipment may be a cellular phone, a cordless telephone set, a session initiation protocol (SIP for short) phone, a smartphone, a wireless local loop (WLL for short) station, a personal digital assistant (PDA for short), a laptop computer, a handheld communications device, a handheld computing device, a satellite wireless device, a wireless modem card, and/or another processing device for communication in a wireless system. For example, the user equipment may be a mobile terminal that can access wireless communications networks such as 3G, 4G, LTE, and 5G, or may be a mobile terminal that performs D2D wireless communication between devices. The mobile terminal may include components such as an RF (Radio Frequency) transmitter (or a radio frequency circuit), a memory, another input device, a display screen, a sensor, an audio circuit, an I/O (input/output) subsystem, a processor, a charging management chip, and a power management chip. The mobile terminal may further include components such as a camera, a Bluetooth module, a virtual key, and a physical key. Details are not described herein. It can be understood by a person skilled in the art that the structure of the foregoing mobile terminal does not constitute a limitation, and the mobile terminal may include more or fewer components, combine some components, separate some components, or have different component arrangements. Common mobile terminals include, for example, a mobile phone, a tablet computer, a notebook computer, a PDA (personal digital assistant), a palmtop computer, an MID (mobile Internet device), a POS (point of sales), a vehicle-mounted computer, and a wearable device (such as a smartwatch, a smart band, or a pedometer).

The communications device may also be a base station. The base station may be configured to communicate with one or more user equipment devices, or may be configured to communicate with one or more base stations that have some functions of user equipment devices (for example, communication between a macro base station and a micro base station such as an access point). The base station may also be referred to as an access point, a node, a NodeB, an evolved NodeB (eNB), or another network entity, and may include some or all of functions of the foregoing network entities. The base station can communicate with user equipment or another base station through an air interface. The communication may be performed by using one or more sectors. The base station may convert a received air interface frame into an IP (internet protocol) packet, and is used as a router between the wireless terminal and a remaining part of an access network. The access network includes an IP network. The base station may further coordinate management of an air interface attribute, and may be alternatively a gateway between a wired network and a wireless network.

The terms used in the embodiments of this application are merely for the purpose of illustrating specific embodiments, and are not intended to limit this application. The terms "a", "said" and "the" of singular forms used in the embodiments and the appended claims of this application are also intended to include plural forms, unless otherwise specified in the context clearly. It should also be understood that, the term "and/or" used herein indicates and includes any or all possible combinations of one or more associated listed items. In addition, the character "/" in this specification generally indicates an "or" relationship between the associated objects. In addition, "first", "second", and the like in this application do not indicate importance or a sequence, but indicate a distinction only.

In addition, the word "example" in the embodiments of this application is used to represent giving an example, an illustration, or a description. Any embodiment or design scheme described as an "example" in this application should not be explained as being more preferred or having more advantages than another embodiment or design scheme. Exactly, "for example" is used to present a concept in a specific manner. The term "coupling" used in this application may include direct connection of two components coupled to each other, indirect connection through any or a combination of an impedance network, a capacitive reactance network, and an inductive reactance network, or other forms of connection. In this regard, this application does not specifically limit the specific form of connection between the two components coupled to each other. In addition, "coupled to the ground" may refer to being directly connected to the ground (GND) or indirectly connected to the ground.

To achieve a dynamic range of a signal sent on a transmitting link or a signal received on a receiving link, a variable gain amplifier is usually disposed on the transmitting link or the receiving link. In addition, to ensure that a phase of the signal on the link is constant, the variable gain amplifier needs to implement the phase adjustment function. It should be understood that, when applied to the receiving link, the amplifier may be a low noise amplifier (LNA) in the receiver, and when applied to the transmitting link, the amplifier may be a power amplifier (PA) in the transmitter. Certainly, when a transceiver that integrates the functions of the receiver and the transmitter is used, this embodiment of this application is applied to the amplifier disposed on the transmitting link or the receiving link of the transceiver.

Referring to FIG. 1, an embodiment of this application provides an amplifier, specifically including the following:

a first MOS transistor M1, a second MOS transistor M2, and a third MOS transistor M3, where a gate of the first MOS transistor M1 is separately coupled to a signal input end in and a bias voltage input end Vbias; a source of the first MOS transistor M1 is coupled to a power supply V1; a drain of the first MOS transistor M1 is separately coupled to a source of the second MOS transistor M2 and a source of the third MOS transistor M3; a drain of the third MOS transistor M3 is coupled to GND, and a drain of the second MOS transistor M2 is coupled to a signal output end out.

A manner of controlling the foregoing amplifier is as follows: A gate of the second MOS transistor M2 is used to make the second MOS transistor M2 in a conductive state under control of a first gate control signal: a gate of the third MOS transistor M3 is used to: under control of a second gate control signal, change a cut-off state or a conductive state of the third MOS transistor M3 to perform bypass control on an alternating current signal that is output by the drain of the first MOS transistor M1; the bias voltage input end Vbias is used to receive a bias voltage, so as to adjust a phase difference between an input signal at the signal input end in and an output signal at the signal output end out. It should be known that, a signal provided by the power supply V1 to the source of the first MOS transistor M1 usually has a constant current. However, when a gate signal of the first MOS transistor M1 is a time-varying signal, a signal generated at the drain of the first MOS transistor M1 is an alternating current signal.

It should be noted that when the amplifier is in a working state, the first gate control signal of the gate of the second MOS transistor M2 makes the second MOS transistor M2 in the conductive state, and a state of the third MOS transistor M3 is controlled by the second gate control signal of the gate, where M3 has a cut-off state and a conductive state. For example, the gate of the second MOS transistor M2 is connected to a bias voltage module, and the gate of the third MOS transistor M3 is connected to a bias voltage module. The bias voltage module at the gate of the second MOS transistor M2 can provide a first gate control signal for the gate of M2, so as to control the state of M2. The bias voltage module at the gate of the third MOS transistor M3 can provide a second gate control signal for the gate of M3, so as to control the state of M3. For example, as shown in FIG. 1, the gate of the first MOS transistor M1 is connected to the signal input end in through a capacitor C1, and the gate of the first MOS transistor is connected to the bias voltage input end Vbias through a voltage divider resistor R1.

Based on the circuit shown in FIG. 1, a working principle of gain switching is described as follows: When M2 is in the conductive state, the third MOS transistor can be controlled to be cut off, and the amplifier is in a gain state; when the gain of the amplifier needs to be changed, M3 is conducted, and M3 bypasses a part of the alternating current signal to the alternating current ground (the ground GND of the power supply), so that the gain of the amplifier decreases and the amplifier enters another gain state, so as to achieve a variable gain. In addition, when the gain changes, the bias voltage is input to the bias voltage input end to adjust the phase difference between the input signal at the signal input end and the output signal at the signal output end; for example, when M3 is cut off, and in addition, in a gain state, M3 is cut off, a first bias voltage is input to the Vbias terminal of M1, and is kept constant; when the gain needs to be changed, M3 is conducted when the bias voltage of M1 at the Vbias terminal is reduced, for example, a second bias voltage less than the first bias voltage is provided. In this state, due to the decrease of the bias voltage of M1, transconductance gm of M1 decreases, and the gain of the amplifier may decrease, thereby achieving a variable gain.

Figure 2:
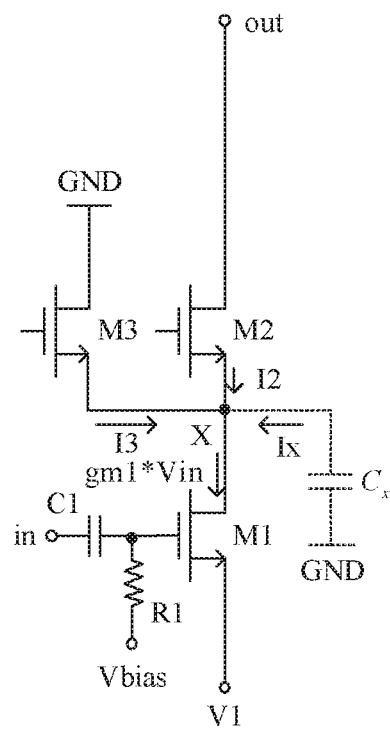
FIG. 2 is a schematic diagram of an equivalent circuit of an amplifier according to an embodiment of this application.

In the process of switching the gain, the phase difference is introduced mainly by changing the transconductance of the second MOS transistor and the third MOS transistor. In this way, when the state of the third MOS transistor is switched (from the cut-off state to the conductive state), changing the bias voltage that is input to the first MOS transistor at the bias voltage input end causes a current signal flowing through the first MOS transistor to change. When the bias voltage of the first MOS transistor is changed properly, the transconductance of the second MOS transistor and the third MOS transistor can be adjusted, so as to flexibly adjust an output phase. Specifically, when the gain is switched only by switching the state of M3, due to existence of parasitic capacitance $C_x$ of a drain node X of M1, the phase during gain switching is changed, and an equivalent model of the amplifier is shown in FIG. 2. The node X has parasitic capacitance $C_x$ to ground, and $C_x$=Cds1+Cdb1+Cgs2+Csb2+Cds3+Csb3+Cgs3. Therefore, the final output current is the current allocated to M1, where Cds1 represents source-drain parasitic capacitance of M1, Cdb1 represents drain substrate parasitic capacitance of M1, Cgs2 represents gate-source parasitic capacitance of M2, Csb2 represents source substrate parasitic capacitance of M2, Cds3 represents source-drain parasitic capacitance of M3, Csb3 represents source substrate parasitic capacitance of M3, and Cgs3 represents gate substrate parasitic capacitance of M3. An alternating current generated by the signal Vin that is input from the signal input end in through M1 is $g_{m1}$*Vin, and the alternating current is split at the node X. At the node X, according to Kirchhoff's current law, $g_{m1}$*Vin=I2+I3+Ix. I2 represents the current flowing through M2, I3 represents the current flowing through M3, Ix represents the current at the node X, Ix represents the current flowing through the capacitor $C_x$, and $g_{m1}$ represents the transconductance of M1. Ignoring the substrate bias effect and the channel length modulation effect, it can be learned according to the admittance shunting relationship that, a phase error of the final output current of the amplifier is as follows:

$$\Delta \text{Phase} = \text{Phase1} - \text{Phase2} \quad (1)$$
$$= \arctan\frac{2\pi f C_{x,off}}{g_{m2,max}} - \arctan\frac{2\pi f C_{x,on}}{g_{m2} + g_{m3}}$$

$g_{m2}$ and $g_{m2,max}$ represent the transconductance of M2 under conditions of a low gain and a maximum gain, respectively: Phase1 represents the phase of the input signal of the amplifier: Phase2 represents the phase of the output signal of the amplifier; $g_{m3}$ represents the transconductance when M3 is conducted $C_{x,on}$ and $C_{x,off}$ represent parasitic capacitance to ground of the node X when M3 is conducted and cut off, respectively. Although the parasitic capacitance of M3 in the conductive and cut-off states changes to some extent, impact of the change on the phase is slight, and can be approximately considered as $C_{x,on} \approx C_{x,off}$. Therefore, according to formula (1), it can be learned that when the gain is switched, the phase difference is introduced mainly by changing the transconductance of M2 and M3. In this application, when the state of M3 is switched (from the cut-off state to the conductive state), reducing the bias voltage that is input to M1 at the Vbias terminal decreases the direct current ID flowing through M1. When the bias voltage at the Vbias terminal is changed properly, then:

$$g_{m2,max}=g_{m2}+g_{m3} \quad (2)$$

With reference to formula (1), it can be learned that the phase error of the amplifier during gain switching is 0 in this case, that is, gain switching with a constant phase is implemented.

Therefore, when the bias voltage input end receives the first bias voltage, the amplifier is in the first gain state: when the bias voltage input end receives the second bias voltage, the amplifier is in the second gain state: the first gain is greater than the second gain. The second bias voltage is determined based on the first bias voltage and a formula $g_{m2,max}-(g_{m2}+g_{m3})$, where $g_{m2,max}$ represents the transconductance of the second MOS transistor when the amplifier is in the first gain state; $g_{m2}$ represents the transconductance of the second MOS transistor when the amplifier is in the second gain state: $g_{m3}$ represents the transconductance of the third MOS transistor in the conductive state. Specifically, the second bias voltage can be determined in the following manner: After the gain is switched through M3, the initial second bias voltage can be input to V bias, and the transconductance of M2 and M3 can be measured. If the phase needs to be constant, it needs to be ensured that $g_{m2,max}-(g_{m2}+g_{m3})$=0. Therefore, the second bias voltage can be adjusted based on the measured transconductance of M2 and M3 until $g_{m2,max}-(g_{m2}+g_{m3})$=0. In this case, the adjusted second bias voltage is kept constant. Certainly, according to formula (1), the second bias voltage can also be adjusted so that $g_{m2,max}-(g_{m2}+g_{m3})$=δ, and the output corresponding to the fixed phase difference is implemented, thereby implementing the phase shift function.

Figure 3:
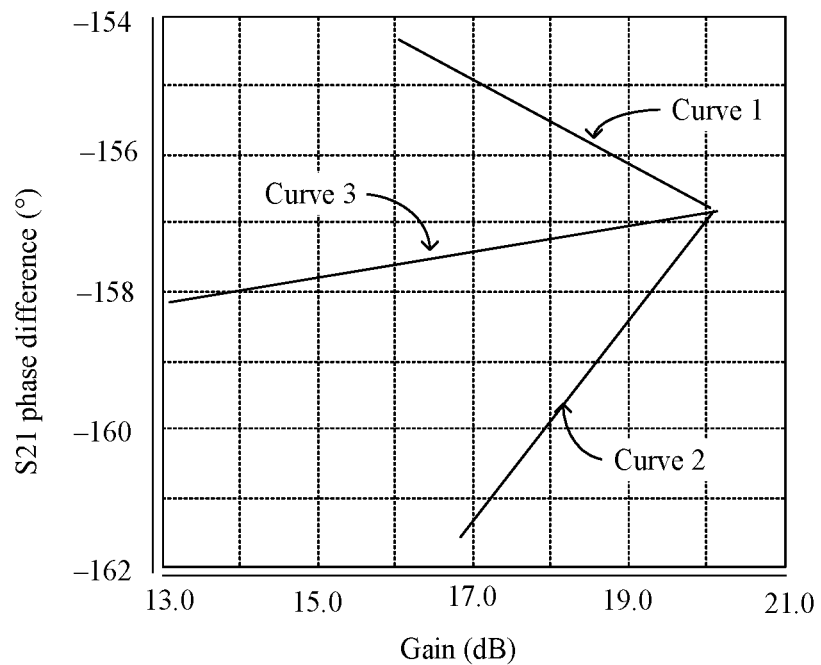
FIG. 3 is a schematic diagram of a relationship between a gain and a phase difference of an amplifier according to an embodiment of this application.

FIG. 3 shows a simulation result of the amplifier proposed in this application. The horizontal axis represents the gain, and the vertical axis represents the phase of the power gain (s21). Curve 1 shows the phase change during gain switching only by switching M3. It can be seen that the phase error introduced through gain switching by 4 decibels (dB) is 3.9 degrees. Curve 2 shows the phase change during gain change only by switching the bias of M1. It can be seen that the phase error introduced through gain switching by 3.2 dB is approximately 4.6 degrees. Curve 3 shows the phase error introduced by using the gain switching manner proposed in this application. It can be seen from FIG. 3 that the phase error introduced through gain switching by 7.1 dB is approximately 1.4 degrees. It can be seen from Table 1 that the phase error slope introduced through gain switching by switching the state of M3 state is 1 degree per decibel (°/dB); the phase error slope introduced through gain switching by adjusting the bias manner of M1 is 1.4°/dB; the phase error slope when the gain control manner provided in the embodiments of this application is only 0.2°/dB, which is far smaller than that of the previous two structures. Therefore, using the gain control manner proposed in this application can implement gain switching with a constant phase.

Figure 4:
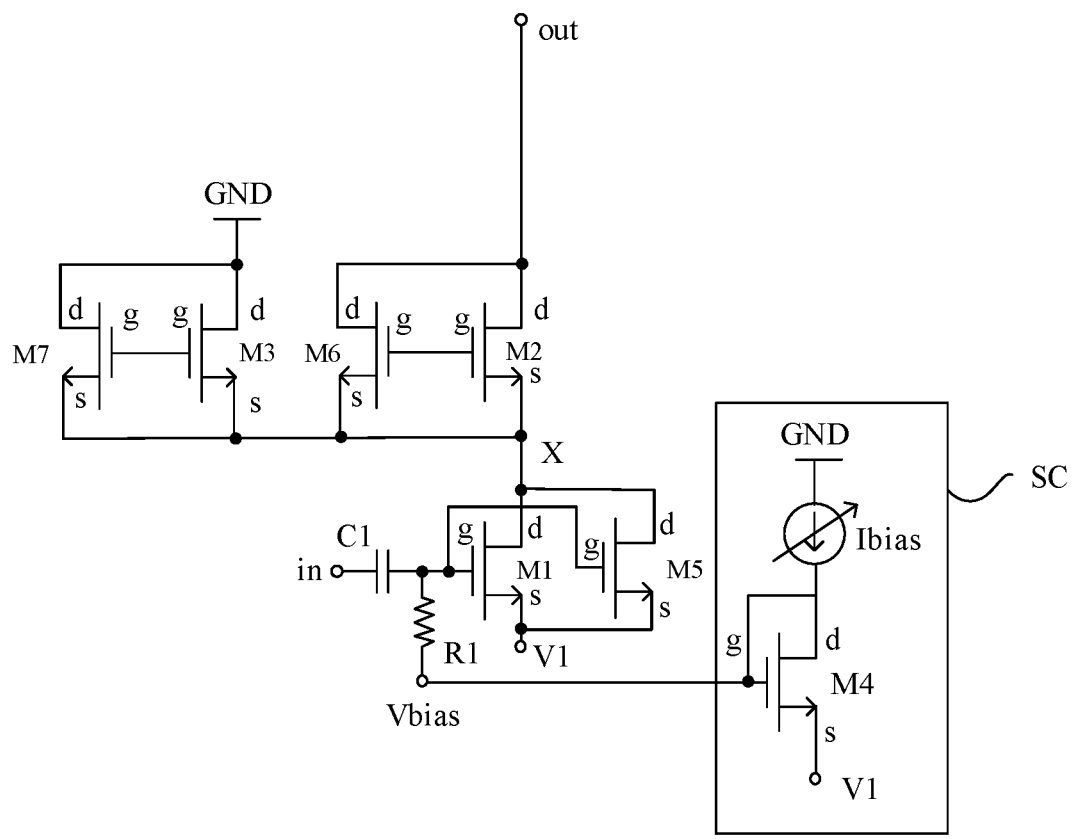
FIG. 4 is a schematic structural diagram of an amplifier according to another embodiment of this application.

As shown in FIG. 4, the amplifier further includes a bias circuit SC. The bias circuit SC includes a current source Ibias and a fourth MOS transistor M4. One end of the current source Ibias is coupled to the ground GND, and the other end of the current source Ibias is coupled to a drain of the fourth MOS transistor M4 and a gate of the fourth MOS transistor M4. The gate of the fourth MOS transistor M4 is coupled to the bias voltage input end Vbias, and a source of the fourth MOS transistor M4 is coupled to the power supply V1.

In addition, the amplifier further includes at least one fifth MOS transistor M5 connected in parallel with the first MOS transistor M1, where a gate of the fifth MOS transistor M5 is coupled to the gate of the first MOS transistor M1; a source of the fifth MOS transistor M5 is coupled to the source of the first MOS transistor M1; a drain of the fifth MOS transistor M5 is coupled to the drain of the first MOS transistor M. It should be noted that, in the working state, a state of at least one M5 is controlled to be the same as that of M1. The amplifier further includes at least one sixth MOS transistor M6 connected in parallel with the second MOS transistor M2, where a gate of the sixth MOS transistor M6 is coupled to the gate of the second MOS transistor M2; a source of the sixth MOS transistor M6 is coupled to the source of the second MOS transistor M2; a drain of the sixth MOS transistor M6 is coupled to the drain of the second MOS transistor M2. It should be noted that, in the working state, a state of at least one M6 is controlled to be the same as that of M2. The amplifier further includes at least one seventh MOS transistor M7 connected in parallel with the third MOS transistor M3, where a gate of the seventh MOS transistor M7 is coupled to the gate of the third MOS transistor M3; a source of the seventh MOS transistor M7 is coupled to the source of the third MOS transistor M3; a drain of the seventh MOS transistor M7 is coupled to the drain of the third MOS transistor M3. It should be noted that, in the working state, a state of at least one M7 is controlled to be the same as that of M3.

Figure 5:
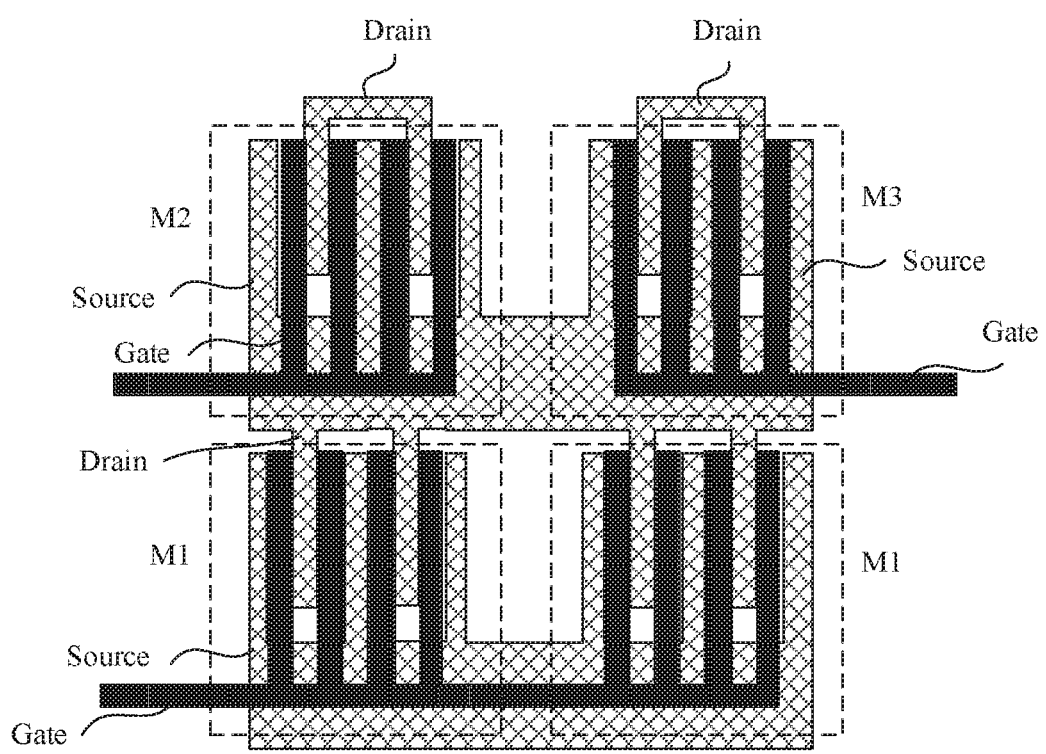
FIG. 5 is a circuit layout diagram of an amplifier according to an embodiment of this application.

FIG. 5 is a circuit layout diagram of an amplifier according to an embodiment of this application. The circuit layout diagram includes three MOS transistors: M1 (which may be parallel connection of one or more M1s; the figure shows a parallel structure of 8 M1s), M2 (which may be parallel connection of one or more M2s; the figure shows a parallel structure of 4 M2s), and M3 (which may be parallel connection of one or more M3s; the figure shows a parallel structure of 4 M3s). The drain of M2 is connected to the signal output end, and the drain of M3 is connected to the ground GND. In the layout diagram, the gates (Gate, where there is an active layer under the gate, and the active layer can be formed by growing silicide or inorganic metal oxide on polyethylene poly) of M1, M2, and M3 are separately connected to a bias voltage module.

Figure 6:
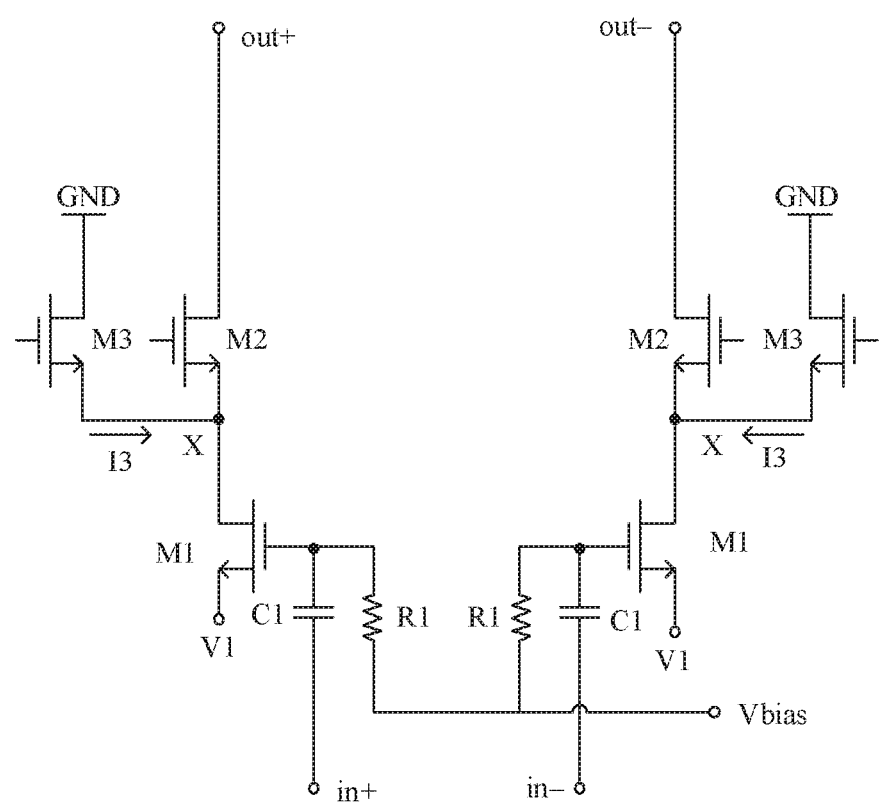
FIG. 6 is a schematic structural diagram of a differential amplifier according to an embodiment of this application.

The amplifiers shown in FIG. 1 and FIG. 4 are single-ended amplifiers. As shown in FIG. 6, an embodiment of this application further provides a differential amplifier, specifically including a first amplifier PA1 and a second amplifier PA2. Forms of the first amplifier PA1 and the second amplifier PA2 are single-ended amplifiers shown in FIG. 1 and FIG. 4. Details are not described herein. A bias voltage input end of the first amplifier PA1 is coupled to a bias voltage input end of the second amplifier PA2.

The foregoing amplifier can also improve the input linearity, as described in detail below:

In the radio frequency transceiver link, the gain is usually reduced because the input signal is excessively large. The gain needs to be reduced to ensure that the input signal is linearly amplified. Therefore, it is usually necessary to improve the input linearity during gain reduction. For the amplifier (VGA), when only M3 is used for gain switching, the alternating current is directly bypassed to the alternating current grounding terminal (GND of the power supply). Therefore, the linearity OP1dB of the output decreases synchronously with the gain, so that the input linearity IP1dB does not change.

For the amplifier, when its input is a sine wave with a frequency $\omega_1$ and an amplitude A, its output includes $\omega_1$ and various orders of harmonic waves of $\omega_1$. Considering the first three orders of harmonic waves with relatively large power, the output of the amplifier can be expressed as follows:

$$y_{out} = g_1 A \cos \omega_1 t + g_2 (A \cos \omega_1 t)_2 + g_3 (A \cos \omega_1 t)^3 \quad (3)$$

$g_1$ represents the transconductance of M1, $g_2$ represents the first derivative of the transconductance of M1, and $g_3$ represents the second derivative of the transconductance of M1. It can be concluded from the foregoing formula that the amplitude of the fundamental frequency signal that is output by the amplifier and the voltage gain of the amplifier are as follows:

$$y_{out,fund} = \left(g_1 A + \frac{3g_3 A^3}{4}\right)\cos\omega_1 t \quad (4)$$

$$Gain_{fund} = g_1 + \frac{3g_3 A^2}{4}$$

For a typical amplifier, its $g_3$ term is a negative number. Therefore, as the amplitude A of the input signal increases, the gain of the fundamental frequency signal gradually decreases. The input signal power when the gain decreases by 1 dB is the definition of the input IP1dB point. Under the condition of the maximum gain, if the bias state of the MOS transistor makes $g_3$ be a negative number, the gain is switched in the M3 state switching+M1 bias manner proposed in this embodiment of this application. When the bias of M1 makes $g_3$ be a positive number, it can be learned according to formula (4) that the gain of the amplifier is no longer compressed, that is, the input IP1dB component contributed by the transconductance $g_{m1}$ of M1 is reduced, so that the IP1dB of the amplifier is increased. From another perspective, in the M3 state switching+M1 bias manner used in this embodiment of this application, the input direct current bias is reduced when the gain is switched, and the overdrive voltage (Vgs−Vth) of M1 is reduced. Therefore, the amplifier is gradually switched from a class A state to a class B state, thereby achieving a constant phase while improving the input linearity (IP1dB) of the amplifier.

In addition, an embodiment of this application provides an amplification circuit, where the amplification circuit includes at least a first amplifier and a second amplifier.

Figure 7:
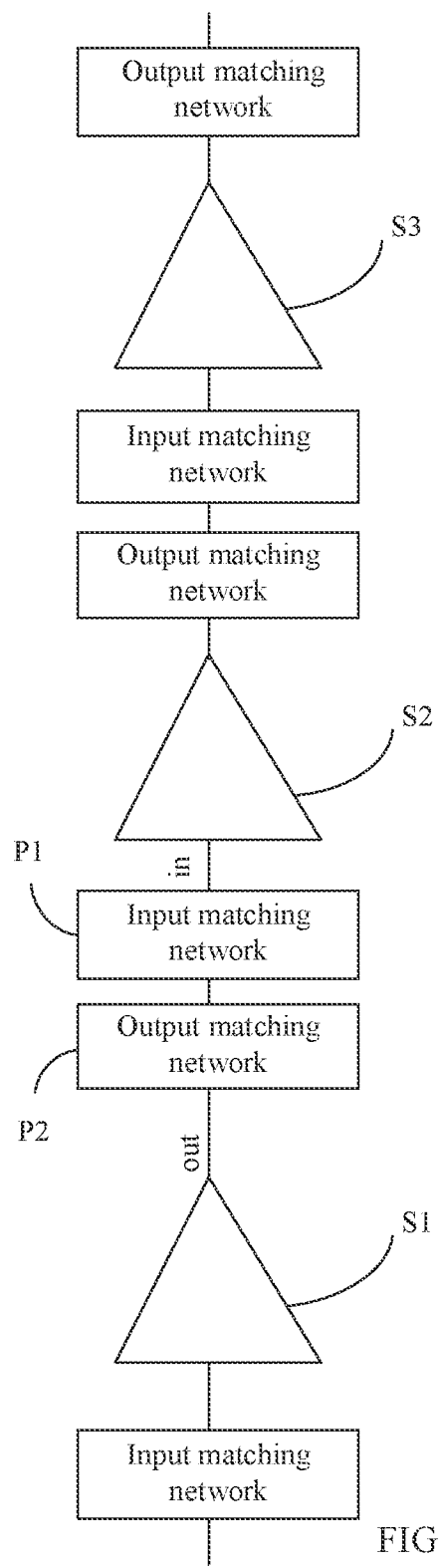
FIG. 7 is a schematic structural diagram of an amplification circuit according to an embodiment of this application.
Figure 8:
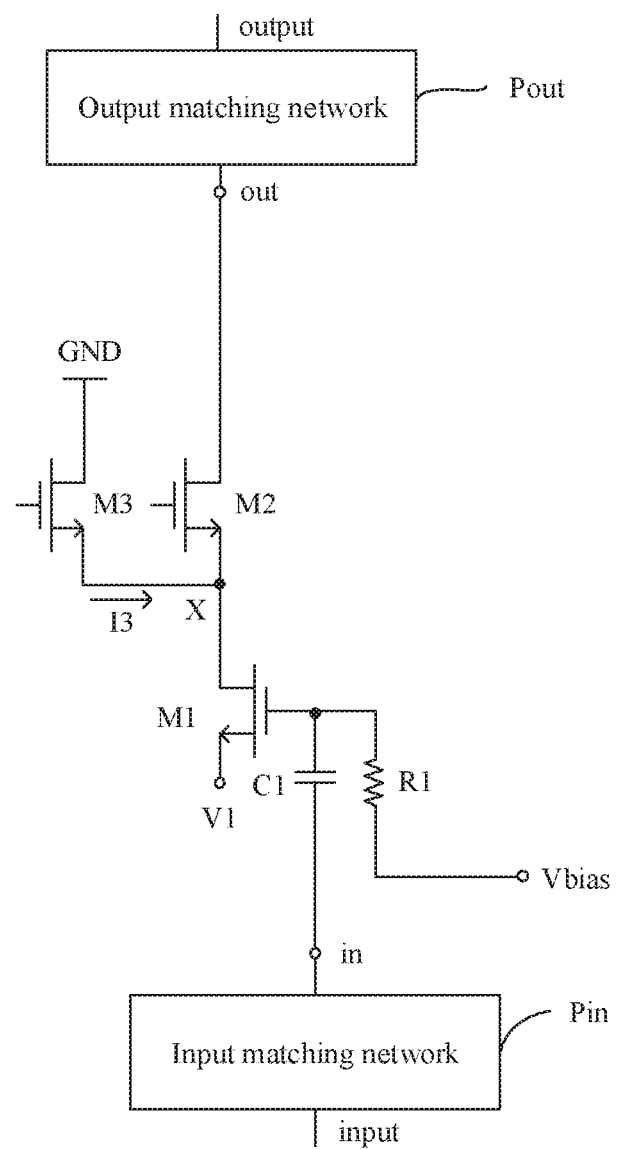
FIG. 8 is a schematic diagram of a connection manner of an amplifier in the amplification circuit shown in FIG. 7 according to an embodiment of this application.

As shown in FIG. 7 and FIG. 8, the amplification circuit includes a first amplifier S1 and a second amplifier S2. The figure further shows a third amplifier S3. An input matching network P1 and an output matching network P2 are provided between the first amplifier S1 and the second amplifier S2. A signal output end out of S1 is coupled to an input end of the output matching network P2. An output end output of the output matching network P2 is coupled to an input end input of the input matching network P1. An output end of the input matching network P1 is coupled to a signal input end in of S2. The output matching network P2 is used to convert a first voltage value of the signal output end of S1 into a second voltage value. The input matching network Pt is used to convert the second voltage value into a third voltage value. Similarly, an input matching network and an output matching network are also provided between the second amplifier S2 and the third amplifier S3. At least one of the first amplifier S1, the second amplifier S2, and the third amplifier S3 is the amplifier provided in the foregoing embodiment. For example, the input matching network P1 and the output matching network P2 may be transformers. The input matching network P1 and the output matching network P2 are mainly used to implement conversion between an output signal and an output signal of cascaded amplifiers, for example, conversion of a voltage or current. In this way, an output signal of an amplifier at a current stage can be used as an input signal of an amplifier at a next stage.

FIG. 8 is used as an example. For an amplifier at each stage, an input matching network Pin is provided on the input side, and an output matching network Pout is provided on the output side. Certainly, the amplifier at each stage may also directly include the input matching network Pin provided on its input side and the output matching network Pout provided on its output side, so that the amplifiers can be directly cascaded.

Figure 9:
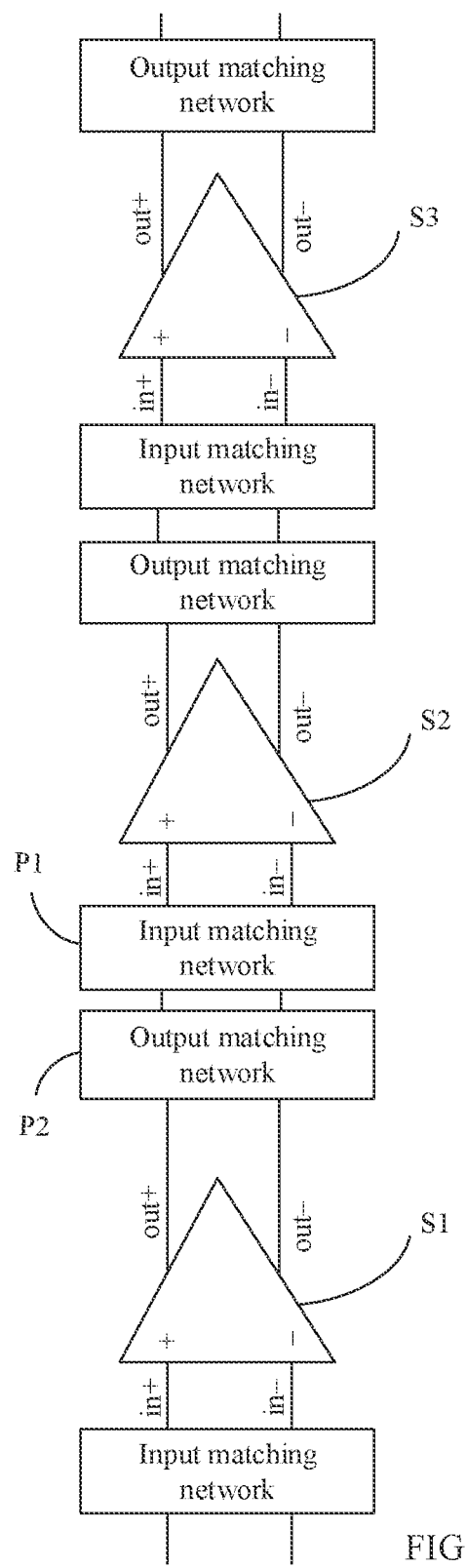
FIG. 9 is a schematic structural diagram of an amplification circuit according to another embodiment of this application.
Figure 10:
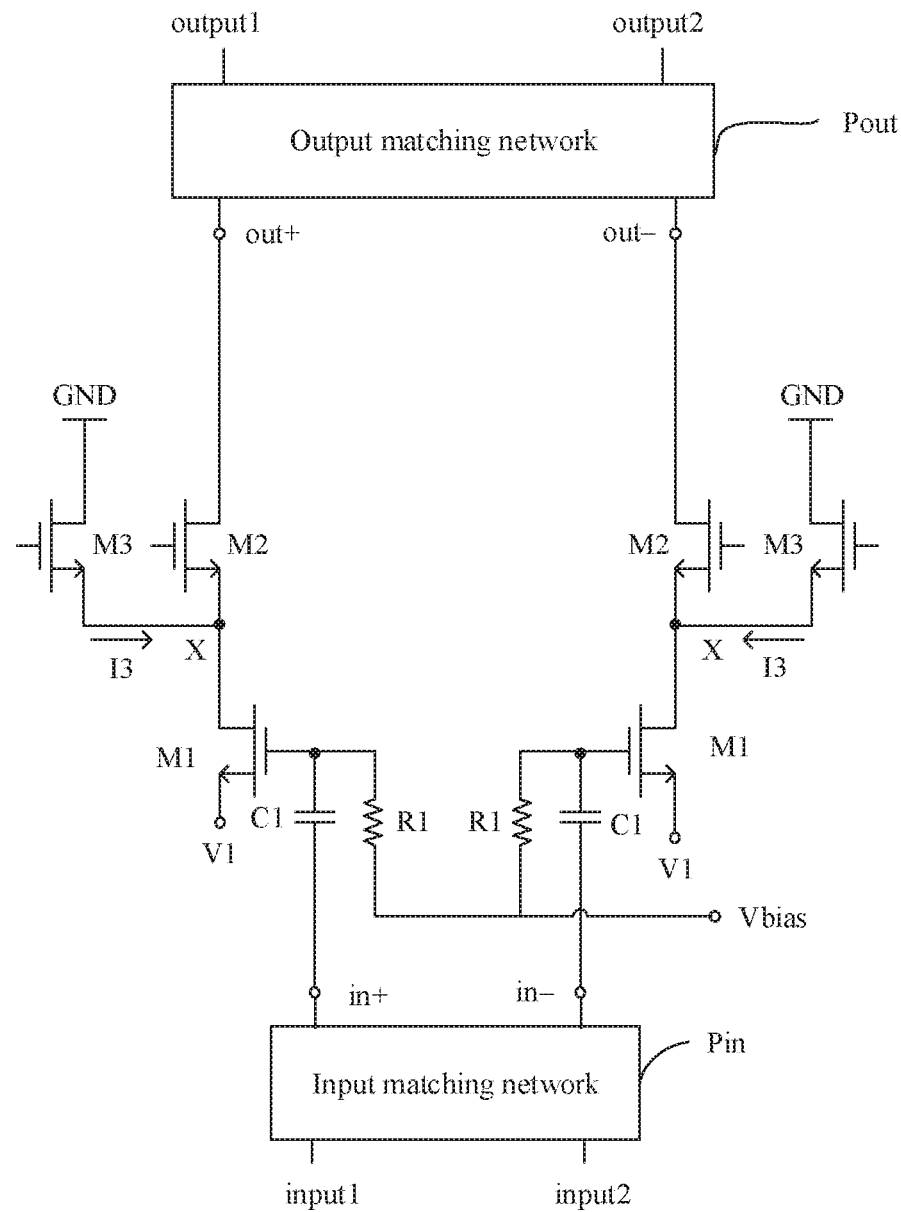
FIG. 10 is a schematic diagram of a connection manner of a differential amplifier in the amplification circuit shown in FIG. 9 according to an embodiment of this application.

When a differential amplifier is used, the amplification circuit includes at least a first differential amplifier and a second differential amplifier. As shown in FIG. 9 and FIG. 10, the amplification circuit includes a first differential amplifier S1, a second differential amplifier S2, and a third differential amplifier S3. An input matching network P1 and an output matching network P2 are provided between the first differential amplifier and the second differential amplifier S2. A signal output end out+ of a first amplifier of the first differential amplifier S1 is coupled to a first input end of the output matching network P2, and a signal output end out− of a second amplifier of the first differential amplifier S1 is coupled to a second input end of the output matching network P2. A first output end output1 of the output matching network P2 is coupled to a first input end input1 of the input matching network P1, and a second output end output2 of the output matching network P2 is coupled to a second input end input2 of the input matching network P1. A first output end of the input matching network P is coupled to a signal input end in+ of a first amplifier of the second differential amplifier S2, and a second output end of the input matching network P1 is coupled to a signal input end in− of a second amplifier of the second differential amplifier. The output matching network P2 is used to convert a first differential signal that is output by a differential amplifier at a previous stage into a second differential signal. The input matching network Pt is used to convert the second differential signal into a third differential signal. The input matching network P1 and the output matching network P2 are mainly used to implement conversion between an output signal and an input signal of cascaded differential amplifiers, for example, conversion of a voltage or current. In this way, an output signal of a differential amplifier at a current stage can be used as an input signal of a differential amplifier at a next stage. Similarly, an input matching network and an output matching network are also provided between the second differential amplifier S2 and the third differential amplifier S3. At least one of the first differential amplifier S1, the second differential amplifier S2, and the third differential amplifier S3 is the amplifier provided in the foregoing embodiment.

FIG. 10 is used as an example. For a differential amplifier at each stage, an input matching network Pin is provided on the input side, and an output matching network Pout is provided on the output side. Certainly, the differential amplifier at each stage may also directly include the input matching network Pin provided on its input side and the output matching network Pout provided on its output side, so that the differential amplifiers can be directly cascaded.

It should be noted that, a gain control manner of the amplification circuit provided in FIG. 7 and FIG. 9 is to switch the gain in an amplifier (or a differential amplifier) at a specific stage in the manner proposed in this application; or to switch the gain by changing the state of M3 at a specific stage, and switch the gain by changing the bias voltage of M1 in an amplifier (or a differential amplifier) at another stage, so as to implement gain switching with a constant phase.

In addition to the IP1dB point, an input third-order intermodulation point IIP3 of the amplifier also determines the linearity of the amplifier. For the IIP3, the nonlinear component of the amplifier is mainly produced by the nonlinearity of the transconductance $g_{m1}$ of M1. The gain is switched in the manner of changing the state of M3 and changing the bias voltage of M1 proposed in this application. As the bias voltage Vbias decreases, the term $g_3$ in formula (3) changes from a negative number to a positive number. Therefore, the nonlinearity terms of the M1 transconductance $g_{m1}$ of the amplifiers (differential amplifiers) at two stages are eliminated, and the third-order intermodulation term (IM3 term) at the output end is reduced. In this case, the gain of the cascaded amplifiers (differential amplifiers) is reduced, and therefore the input linearity IIP3 of the cascaded amplifiers (differential amplifiers) is improved in this case.

Figure 11:
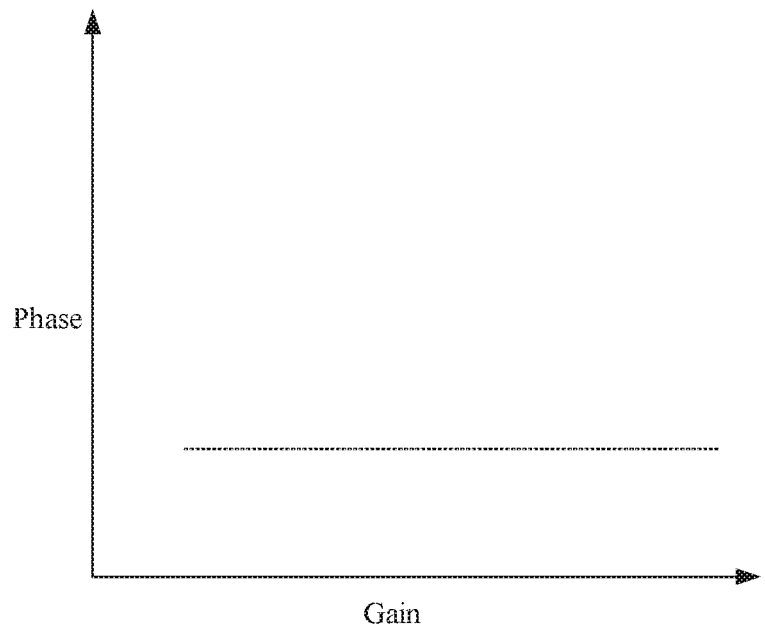
FIG. 11 is a schematic structural diagram of a relationship between a phase and a gain of an output signal of an amplification circuit according to an embodiment of this application.
Figure 12:
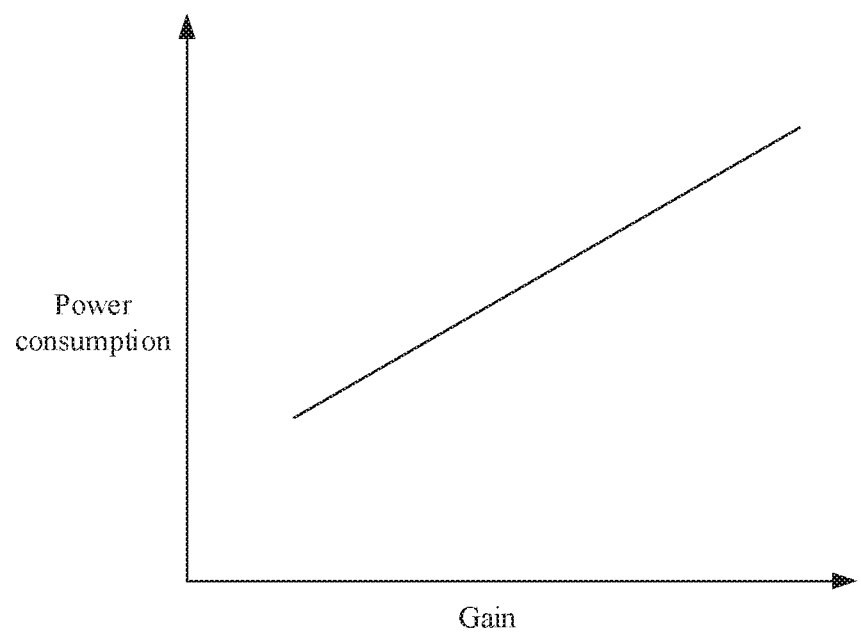
FIG. 12 is a schematic structural diagram of a relationship between power consumption and a gain of an amplification circuit according to an embodiment of this application.
Figure 13:
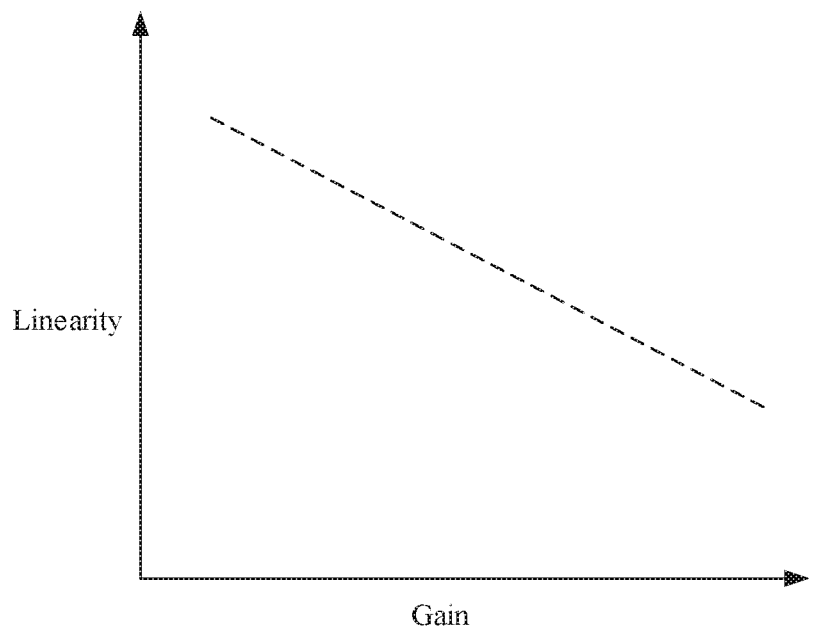
FIG. 13 is a schematic structural diagram of a relationship between input linearity and a gain of an amplification circuit according to an embodiment of this application.

FIG. 11 to FIG. 13 show characteristic points introduced by the amplification circuit provided in FIG. 7 to FIG. 10 to the signal transceiver link when the gain switching manner proposed in this application is used. It can be learned from the previous analysis that, in this application, the gain is switched in the manner of changing the state of M3 and changing the bias voltage of M1, so as to implement gain switching. FIG. 11 shows a relationship between the gain and the phase. The horizontal axis represents the gain (the gain gradually increases along the horizontal axis rightwards), and the vertical axis represents the phase (the phase gradually increases along the vertical axis upwards). Clearly, when the gain is switched (the gain changes), the phase corresponding to the gain (S21 or voltage gain) basically remains constant or changes slightly. FIG. 12 shows a relationship between the gain and the power consumption. The horizontal axis represents the gain (the gain gradually increases along the horizontal axis rightwards), and the vertical axis represents the power consumption (the power consumption gradually increases along the vertical axis upwards). Clearly, the power consumption is low when the gain is low, and the power consumption is high when the gain is high. FIG. 13 shows a relationship between the gain and the input linearity. The horizontal axis represents the gain (the gain gradually increases along the horizontal axis rightwards), and the vertical axis represents the input linearity (the linearity gradually increases along the vertical axis upwards). As the gain decreases, the input linearity (IP1dB or IIP3) gradually increases.

Figure 14:
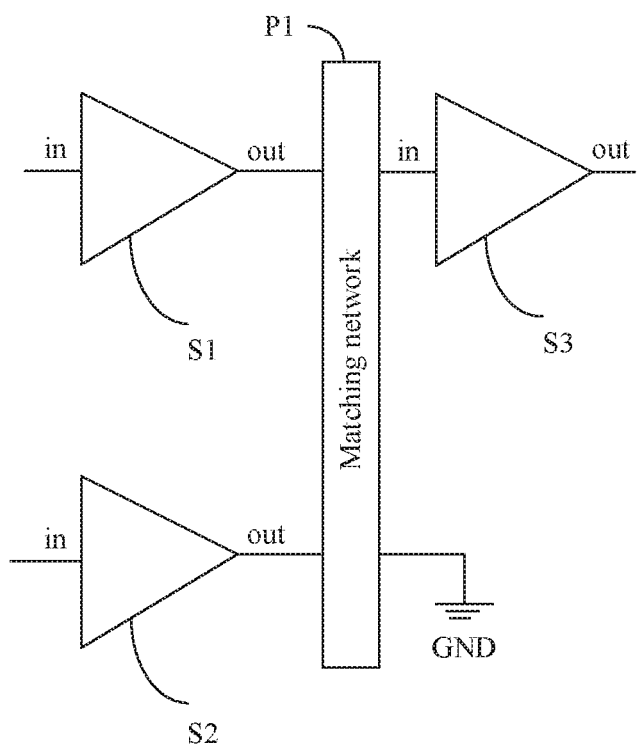
FIG. 14 is a schematic structural diagram of a phase shifter according to an embodiment of this application.

As shown in FIG. 14, an embodiment of this application provides a phase shifter, including a first amplifier S1, a second amplifier S2, a third amplifier S3, and a matching network P1.

A signal output end out of the first amplifier S1 is coupled to a first input end of the matching network P1, and a signal output end out of the second amplifier S2 is coupled to a second input end of the matching network P1; a first output end of the matching network P1 is coupled to a signal input end in of the third amplifier, and a second input end of the matching network P1 is coupled to the ground GND; the matching network P1 is used to convert a first voltage difference between the signal output end of the first amplifier S1 and the signal output end of the second amplifier S2 into a second voltage difference. At least one of the first amplifier S1, the second amplifier S2, and the third amplifier S3 is the amplifier provided in the foregoing embodiment.

Figure 15:
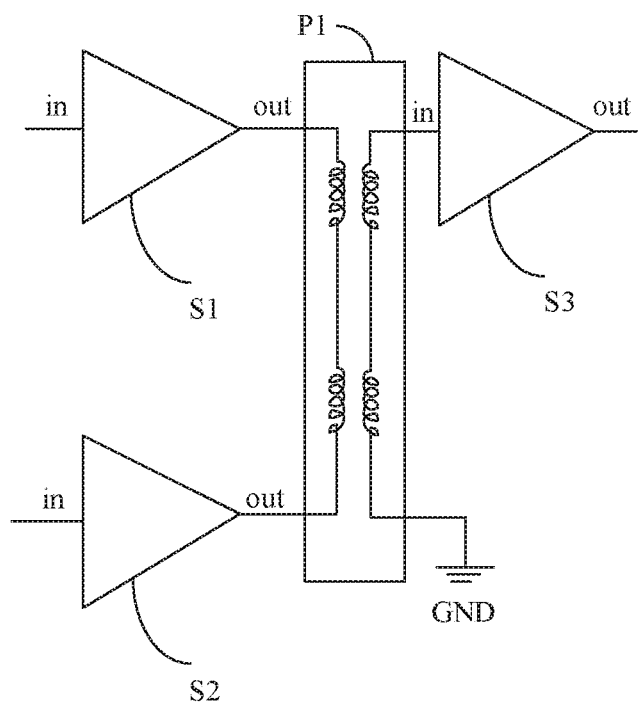
FIG. 15 is a schematic structural diagram of a phase shifter according to another embodiment of this application.

For example, as shown in FIG. 15, the matching network P1 may be a transformer, and in this case, two primary input ends of the transformer are respectively connected to the signal output end out of the first amplifier S1 and the signal output end out of the second amplifier S2. Two secondary output ends of the transformer are respectively connected to the signal input end in of the third amplifier and the ground GND.

Figure 16:
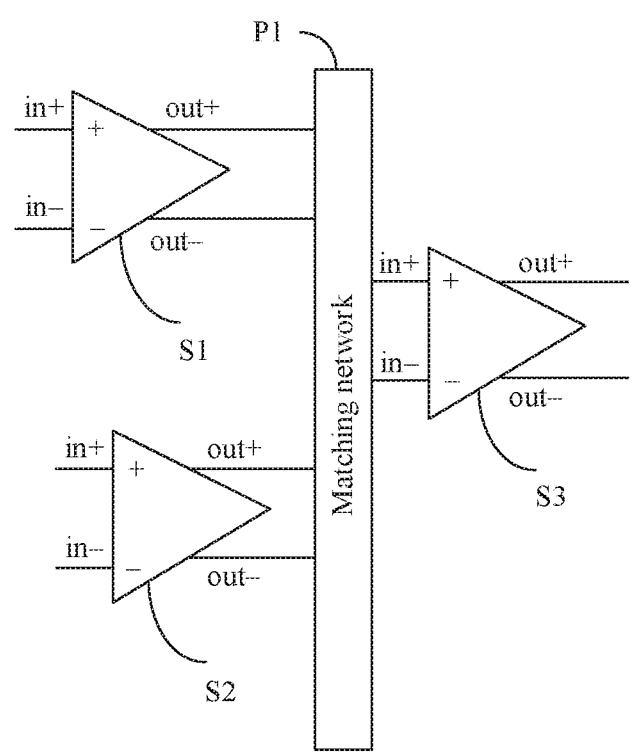
FIG. 16 is a schematic structural diagram of a phase shifter according to still another embodiment of this application.

As shown in FIG. 16, when a differential amplifier is used, an embodiment of this application provides a phase shifter, including a first differential amplifier S1, a second differential amplifier S2, a third differential amplifier S3, and a matching network P1, where a signal output end out+ of a first amplifier of the first differential amplifier S is coupled to a first input end of the matching network P1, and a signal output end out– of a second amplifier of the first differential amplifier S1 is coupled to a second input end of the matching network P1; a signal output end out+ of a first amplifier of the second differential amplifier S2 is coupled to a third input end of the matching network P1, and a signal output end out– of a second amplifier of the second differential amplifier S2 is coupled to a fourth input end of the matching network P1; a first output end of the matching network P is coupled to a signal input end in+ of a first amplifier of the third differential amplifier S3, and a second input end of the matching network P1 is coupled to a signal input end in– of a second amplifier of the third differential amplifier; the matching network P1 is used to combine a first differential signal that is output by the first differential amplifier S and a second differential signal that is output by the second differential amplifier S2 into a third differential signal, and input the third differential signal to the third differential amplifier S3. At least one of the first differential amplifier S1, the second differential amplifier S2, and the third differential amplifier S3 is the amplifier provided in the foregoing embodiment. For example, the matching network P1 may be a combining device, such as a power combining device, a voltage combining device, or a current combining device.

Figure 17:
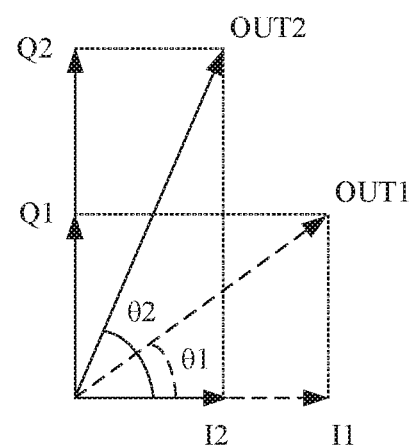
FIG. 17 is a schematic diagram of combining orthogonal signals according to an embodiment of this application.

The phase shifter provided based on FIG. 14 to FIG. 16 can adjust the gain when combining orthogonal signals (I signal and Q signal). The phase shifter provided in FIG. 14 is used for description. The voltage Vin_I of the I signal can be input from the signal input end of S1, and the voltage Vin_Q of the Q signal can be input from the signal input end of S2. Then the gain and the phase of Vin_1 and the gain and the phase of Vin_Q are adjusted through S and S2 respectively, thereby changing the combination ratio of Vin_I and Vin_Q. Finally, the gain and the phase of the combined signal can be adjusted through S3, and an active phase shifter can be implemented based on a variable gain amplifier. The implementation principle of the phase shifter is shown in FIG. 17. The gains of S1 and S2 are changed so that the orthogonal signals I and Q are amplified differently and then combined. Finally, the output Vout_I of S1 and the output Vout_Q of S2 have different phases Φ1 and Φ2, thereby implementing the phase shift function. When the gains of the I signal and the Q signal are adjusted, the manner of gain switching with a constant phase proposed in this application can be used to avoid introducing an additional phase difference and reducing the precision of the active phase shifter. Then, because the signals that are output by the active phase shifter after combination have different amplitudes, to reduce gain fluctuation under different phases, the final output can be adjusted through S3 after combination. In addition, S3 uses the manner of gain control with a constant phase proposed in this application. This can ensure that no additional phase difference is introduced during gain adjustment, and ensure the phase accuracy of the active phase shifter. Referring to FIG. 17, the orthogonal signals I1 and Q1 are amplified and then combined to obtain an output signal OUT1 with a phase θ1, and the orthogonal signals I2 and Q2 are amplified and then combined to obtain an output signal OUT2 with a phase θ2. In addition, it should be noted that when the phase shifter shown in FIG. 16 is used, the principle is similar to that described above, except that the I signal and the Q signal are in the form of differential signals.

The foregoing descriptions are merely specific implementations of this application, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. An amplifier, comprising:
a first MOS transistor;
a second MOS transistor; and
a third MOS transistor,
wherein a gate of the first MOS transistor is separately coupled to a signal input end and a bias voltage input end, a source of the first MOS transistor is coupled to a power supply, and a drain of the first MOS transistor is separately coupled to a source of the second MOS transistor and a source of the third MOS transistor, a drain of the third MOS transistor is coupled to a ground, and a drain of the second MOS transistor is coupled to a signal output end,
wherein the second MOS transistor is configured to be in a conductive state under a control of a first gate control signal at a gate of the second MOS transistor, and the third MOS transistor is configured to: under control of a second gate control signal at a gate of the third MOS transistor, change a cut-off state or a conductive state of the third MOS transistor to perform bypass control on an alternating current signal that is output by the drain of the first MOS transistor,
wherein the bias voltage input end is configured to receive a bias voltage to adjust a phase difference between an input signal at the signal input end and an output signal at the signal output end,
wherein the bias voltage input end is configured to receive a first bias voltage when the third MOS transistor is in the cut-off state, and
wherein the bias voltage input end is configured to receive a second bias voltage when the third MOS transistor is in the conductive state, wherein the first bias voltage is greater than the second bias voltage.

2. The amplifier according to claim 1, wherein:
the amplifier is configured to be in a first gain state when the bias voltage input end receives the first bias voltage, and
the amplifier is configured to be in a second gain state when the bias voltage input end receives the second bias voltage, wherein a gain of the amplifier in the first gain state is greater than a gain of the amplifier in the second gain state.

3. The amplifier according to claim 2, wherein the second bias voltage is determined according to the first bias voltage and a formula $g_{m2,max}-(g_{m2}+g_{m3})$,
where $g_{m2,max}$ represents a transconductance of the second MOS transistor when the amplifier is in the first gain state, $g_{m2}$ represents a transconductance of the second MOS transistor when the amplifier is in the second gain state, and $g_{m3}$ represents a transconductance of the third MOS transistor in the conductive state.

4. The amplifier according to claim 1, further comprising a bias circuit including:
a current source and
a fourth MOS transistor,
wherein a first end of the current source is coupled to the ground, and a second end of the current source is coupled to a drain of the fourth MOS transistor and a gate of the fourth MOS transistor, and
wherein the gate of the fourth MOS transistor is coupled to the bias voltage input end, and a source of the fourth MOS transistor is coupled to the power supply.

5. The amplifier according to claim 1, wherein the gate of the first MOS transistor is connected to the bias voltage input end through a voltage divider resistor.

6. The amplifier according to claim 1, further comprising a fifth MOS transistor connected in parallel with the first MOS transistor,
wherein a gate of the fifth MOS transistor is coupled to the gate of the first MOS transistor, a source of the fifth MOS transistor is coupled to the source of the first MOS transistor, and a drain of the fifth MOS transistor is coupled to the drain of the first MOS transistor.

7. The amplifier according to claim 1, further comprising a sixth MOS transistor connected in parallel with the second MOS transistor,
wherein a gate of the sixth MOS transistor is coupled to the gate of the second MOS transistor, a source of the sixth MOS transistor is coupled to the source of the second MOS transistor, and a drain of the sixth MOS transistor is coupled to the drain of the second MOS transistor.

8. The amplifier according to claim 1, further comprising a seventh MOS transistor connected in parallel with the third MOS transistor,
wherein a gate of the seventh MOS transistor is coupled to the gate of the third MOS transistor, a source of the seventh MOS transistor is coupled to the source of the third MOS transistor, and a drain of the seventh MOS transistor is coupled to the drain of the third MOS transistor.

9. An amplification circuit, comprising:
a first amplifier having a first signal input end and a first signal output end;
a second amplifier having a second signal input end and a second signal output end; and
an input matching network and an output matching network disposed between the first amplifier and the second amplifier,
wherein the first signal output end of the first amplifier is coupled to an input end of the output matching network, an output end of the output matching network is coupled to an input end of the input matching network, and an output end of the input matching network is coupled to the second signal input end of the second amplifier,
wherein the output matching network is configured to convert a first voltage value of the first signal output end of the first amplifier into a second voltage value,
wherein the input matching network is configured to convert the second voltage value into a third voltage value, and
wherein at least one of the first amplifier or the second amplifier comprises:
a first MOS transistor;
a second MOS transistor;
a third MOS transistor,
a signal input end and a signal output end, and
a bias voltage input end,
wherein a gate of the first MOS transistor is separately coupled to the signal input end and the bias voltage input end, a source of the first MOS transistor is coupled to a power supply, and a drain of the first MOS transistor is separately coupled to a source of the second MOS transistor and a source of the third MOS transistor, a drain of the third MOS transistor is coupled to a ground, and a drain of the second MOS transistor is coupled to the signal output end,
wherein the second MOS transistor is configured to be in a conductive state under a control of a first gate control signal at a gate of the second MOS transistor, the third MOS transistor is configured to: under control of a second gate control signal at a gate of the third MOS transistor, change a cut-off state or a conductive state of the third MOS transistor to perform bypass control on an alternating current signal that is output by the drain of the first MOS transistor, and
wherein the bias voltage input end is configured to: receive a bias voltage to adjust a phase difference between an input signal at the signal input end and an output signal at the signal output end.

10. The amplification circuit according to claim 9, wherein:
the bias voltage input end is configured to receive a first bias voltage when the third MOS transistor is in the cut-off state, and
the bias voltage input end is configured to receive a second bias voltage when the third MOS transistor is in the conductive state, wherein the first bias voltage is greater than the second bias voltage.

11. The amplification circuit according to claim 10, wherein:
the at least one of the first amplifier or the second amplifier is configured to be in a first gain state when the bias voltage input end receives the first bias voltage, and
the at least one of the first amplifier or the second amplifier is configured to be in a second gain state when the bias voltage input end receives the second bias voltage,
wherein a gain of the at least one of the first amplifier or the second amplifier in the first gain state is greater than a gain of the at least one of the first amplifier or the second amplifier in the second gain state.

12. The amplification circuit according to claim 11, wherein the second bias voltage is determined according to the first bias voltage and a formula $g_{m2,max}-(g_{m2}+g_{m3})$,
where $g_{m2,max}$ represents a transconductance of the second MOS transistor when the amplifier is in the first gain state, $g_{m2}$ represents a transconductance of the second MOS transistor when the amplifier is in the second gain state, and $g_{m3}$ represents a transconductance of the third MOS transistor in the conductive state.

13. The amplification circuit according to claim 9, wherein the at least one of the first amplifier or the second amplifier further comprises a bias circuit including:
a current source and
a fourth MOS transistor,
wherein a first end of the current source is coupled to the ground, and a second end of the current source is coupled to a drain of the fourth MOS transistor and a gate of the fourth MOS transistor, and wherein the gate of the fourth MOS transistor is coupled to the bias voltage input end, and a source of the fourth MOS transistor is coupled to the power supply.

14. The amplification circuit according to claim 9, wherein the gate of the first MOS transistor is connected to the bias voltage input end through a voltage divider resistor.

15. The amplification circuit according to claim 9, wherein the at least one of the first amplifier or the second amplifier further comprises a fifth MOS transistor connected in parallel with the first MOS transistor,
   wherein a gate of the fifth MOS transistor is coupled to the gate of the first MOS transistor, a source of the fifth MOS transistor is coupled to the source of the first MOS transistor, and a drain of the fifth MOS transistor is coupled to the drain of the first MOS transistor.

16. The amplification circuit according to claim 9, wherein the at least one of the first amplifier or the second amplifier further comprises a sixth MOS transistor connected in parallel with the second MOS transistor,
   wherein a gate of the sixth MOS transistor is coupled to the gate of the second MOS transistor, a source of the sixth MOS transistor is coupled to the source of the second MOS transistor, and a drain of the sixth MOS transistor is coupled to the drain of the second MOS transistor.

17. The amplification circuit according to claim 9, wherein the at least one of the first amplifier or the second amplifier further comprises a seventh MOS transistor connected in parallel with the third MOS transistor,
   wherein a gate of the seventh MOS transistor is coupled to the gate of the third MOS transistor, a source of the seventh MOS transistor is coupled to the source of the third MOS transistor, and a drain of the seventh MOS transistor is coupled to the drain of the third MOS transistor.

18. A phase shifter, comprising:
   a first amplifier having a first signal input end and a first signal output end;
   a second amplifier having a second signal input end and a second signal output end;
   a third amplifier having a third signal input end and a third signal output end; and
   a matching network,
   wherein the first signal output end of the first amplifier is coupled to a first input end of the matching network, and the second signal output end of the second amplifier is coupled to a second input end of the matching network,
   wherein a first output end of the matching network is coupled to the third signal input end of the third amplifier, and the second input end of the matching network is coupled to a ground,
   wherein the matching network is configured to convert a first voltage difference between the first signal output end of the first amplifier and the second signal output end of the second amplifier into a second voltage difference, and
   wherein at least one of the first amplifier, the second amplifier, or the third amplifier comprise:
   a first MOS transistor;
   a second MOS transistor;
   a third MOS transistor,
   a signal input end and a signal output end, and
   a bias voltage input end,
   wherein a gate of the first MOS transistor is separately coupled to the signal input end and the bias voltage input end, a source of the first MOS transistor is coupled to a power supply, and a drain of the first MOS transistor is separately coupled to a source of the second MOS transistor and a source of the third MOS transistor, a drain of the third MOS transistor is coupled to the ground, and a drain of the second MOS transistor is coupled to the signal output end,
      wherein the second MOS transistor is configured to be in a conductive state under a control of a first gate control signal at a gate of the second MOS transistor, the third MOS transistor is configured to: under control of a second gate control signal at a gate of the third MOS transistor, change a cut-off state or a conductive state of the third MOS transistor to perform bypass control on an alternating current signal that is output by the drain of the first MOS transistor, and
      wherein the bias voltage input end is configured to receive a bias voltage to adjust a phase difference between an input signal at the signal input end and an output signal at the signal output end.

19. The phase shifter according to claim 18, wherein the at least one of the first amplifier, the second amplifier, or the third amplifier comprising:
   a bias circuit including:
      a current source, and
      a fourth MOS transistor,
      wherein a first end of the current source is coupled to the ground, and a second end of the current source is coupled to a drain of the fourth MOS transistor and a gate of the fourth MOS transistor, and wherein the gate of the fourth MOS transistor is coupled to the bias voltage input end, and a source of the fourth MOS transistor is coupled to the power supply;
   a fifth MOS transistor connected in parallel with the first MOS transistor, wherein a gate of the fifth MOS transistor is coupled to the gate of the first MOS transistor, a source of the fifth MOS transistor is coupled to the source of the first MOS transistor, and a drain of the fifth MOS transistor is coupled to the drain of the first MOS transistor;
   a sixth MOS transistor connected in parallel with the second MOS transistor, wherein a gate of the sixth MOS transistor is coupled to the gate of the second MOS transistor, a source of the sixth MOS transistor is coupled to the source of the second MOS transistor, and a drain of the sixth MOS transistor is coupled to the drain of the second MOS transistor; and
   a seventh MOS transistor connected in parallel with the third MOS transistor, wherein a gate of the seventh MOS transistor is coupled to the gate of the third MOS transistor, a source of the seventh MOS transistor is coupled to the source of the third MOS transistor, and a drain of the seventh MOS transistor is coupled to the drain of the third MOS transistor.

* * * * *